United States Patent
Stamos et al.

(10) Patent No.: US 6,906,914 B2
(45) Date of Patent: Jun. 14, 2005

(54) METHOD AND APPARATUS FOR MOUNTING A BACKPLANE IN A CHASSIS

(75) Inventors: Theodore C. Stamos, Round Rock, TX (US); Raymond D. Heistand, II, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 88 days.

(21) Appl. No.: 10/137,149

(22) Filed: May 2, 2002

(65) Prior Publication Data

US 2003/0206398 A1 Nov. 6, 2003

(51) Int. Cl.$^7$ ................................................ G06F 1/16
(52) U.S. Cl. .................... 361/683; 361/679; 361/685; 361/686
(58) Field of Search .......................... 361/679, 683–687, 361/724–727; 312/223.1–223.2

(56) References Cited

U.S. PATENT DOCUMENTS

| | | | | |
|---|---|---|---|---|
| 5,761,033 A | * | 6/1998 | Wilhelm | ............... 361/686 |
| 6,185,093 B1 | | 2/2001 | Moss | |
| 2003/0051024 A1 | * | 3/2003 | Garnett et al. | |

* cited by examiner

*Primary Examiner*—Yean-Hsi Chang
(74) *Attorney, Agent, or Firm*—Haynes and Boone, LLP

(57) ABSTRACT

A computer includes a chassis having a stop member and an alignment member extending adjacent the stop member. A first component cavity is defined in the cavity on a first side of the stop member and a second component cavity is defined in the cavity on a second side of the stop member. A backplane is mounted on the alignment member whereby the first and second component cavities are separated. A component sub-chassis is slidably mounted in one of the first and second component cavities.

16 Claims, 7 Drawing Sheets

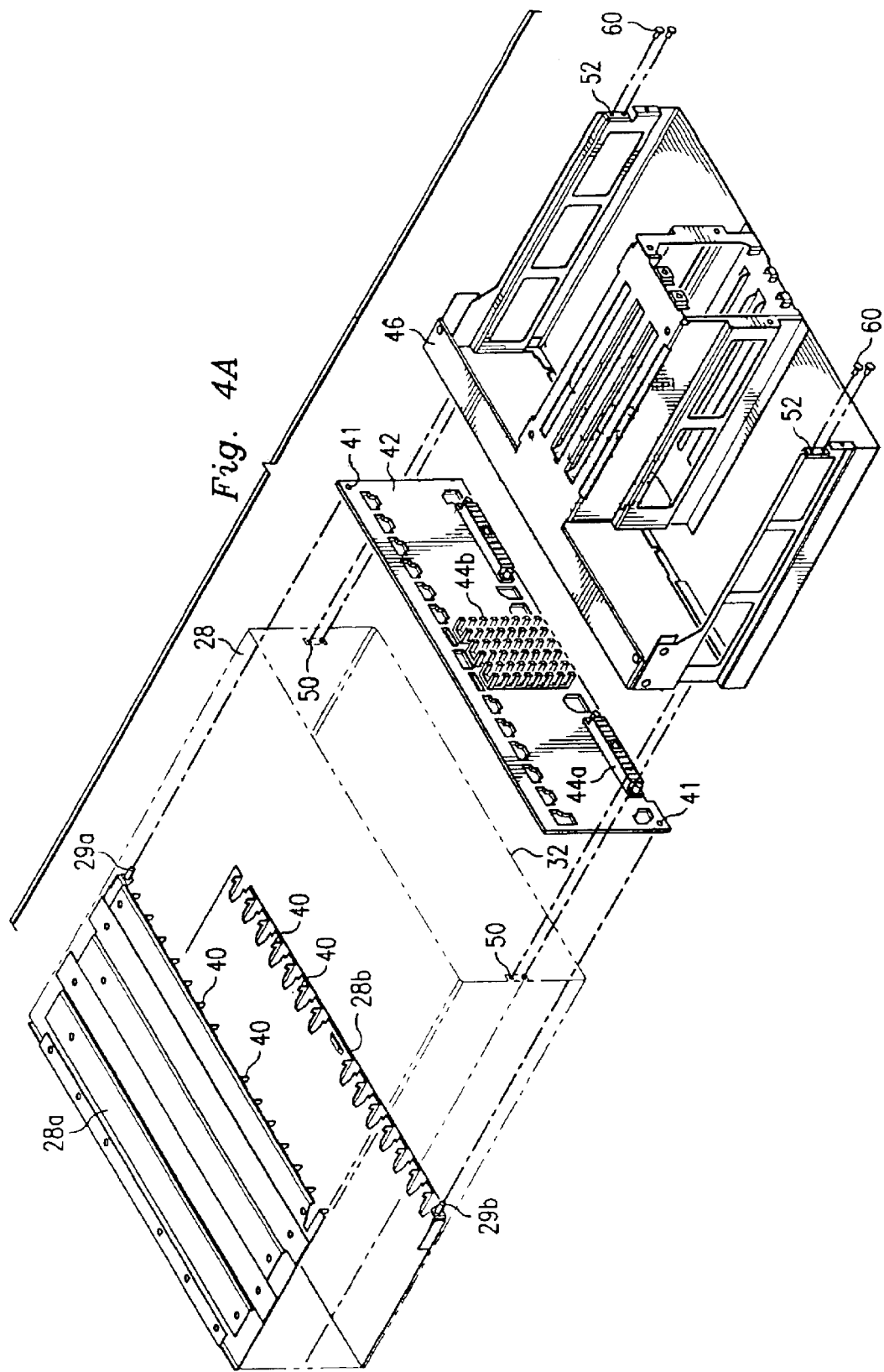

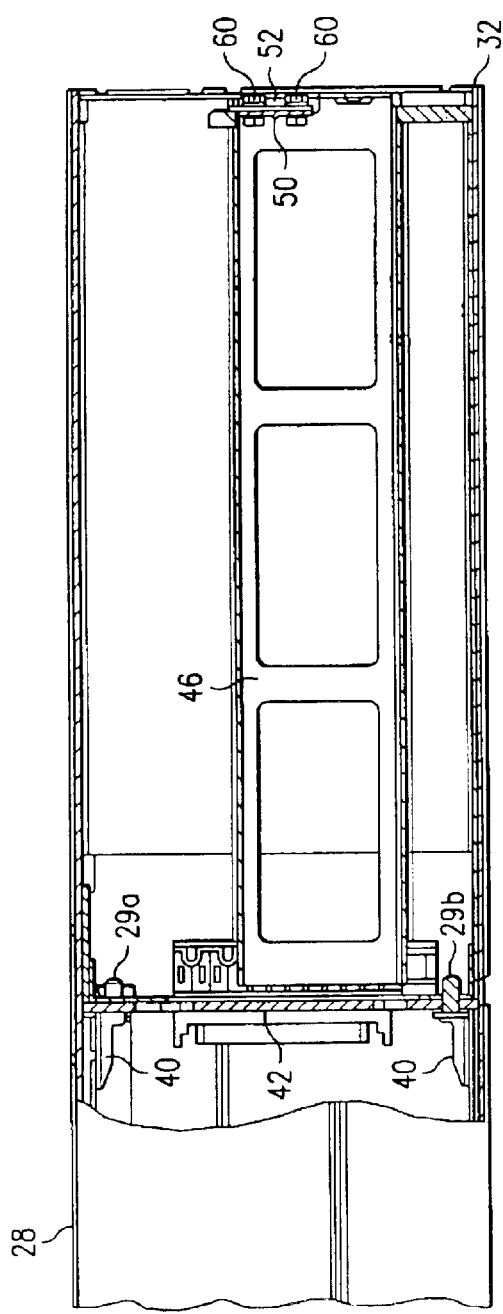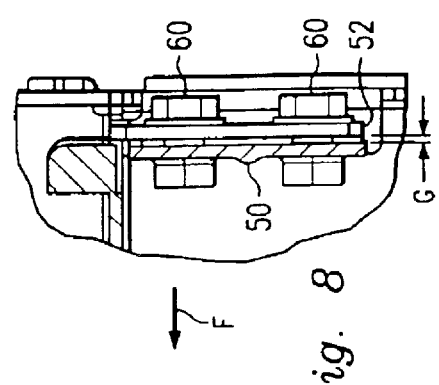

METHOD AND APPARATUS FOR MOUNTING A BACKPLANE IN A CHASSIS

BACKGROUND

The disclosures herein relate generally to computer systems and more particularly to mounting a backplane in a chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs is and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In computer applications where rack mounted equipment has a modular design and it is desirable to plug components and assemblies/modules in from the front and back of an enclosure, the assemblies/modules are divided by a backplane printed circuit assembly that has connections and routings for the various modules and components. As rack mounted equipment (and other computer equipment) has moved to a modular design for easy replacement of components permitting higher density and easy configuration by selection of modules, the ease of replacement of components by removing them from the front or rear of the assembly without removal from the rack is desirable. One problem has been the mounting of the printed circuit assembly that is known as the backplane. Because the enclosure is, in essence, a square tube with various functional assemblies plugging in from both front and rear (including fan/blower modules, power supplies, IO assemblies, computer modules and disk drive modules), the backplane is, by necessity, placed in a central location within the enclosure. Mounting and access to the fasteners that attach this printed circuit assembly to the chassis has been a problem. Special tools and fastener drivers have been used to gain access to these fastener locations deep within the enclosure. Service replacement of this assembly and initial factory assembly has been difficult and has required excessive time to access these multiple fasteners with special tools.

Current mounting methods include screws at various attachment points within the enclosure and/or a split enclosure that requires separation of the chassis components to remove the backplane. The fastener mounting method provides a mounting surface within the enclosure at the plane that locates the board in position from the front to back of the enclosure. Screws are used to laterally locate the board and a special lengthened driver is used to install the numerous screws to attach the board at this internal mounting surface.

Therefore, what is needed is a backplane mounting for a computer chassis which is easy to assemble, remove and/or service without the need for special tools and prolonged down-time.

SUMMARY

One embodiment, accordingly, provides a method and apparatus for mounting a backplane in a computer chassis. To this end, an electronic component housing includes a chassis having a stop member and an alignment member extending adjacent the stop member. A first component cavity is defined in the cavity on a first side of the stop member and a second component cavity is defined in the cavity on a second side of the stop member. A backplane is mounted on the alignment member whereby the first and second component cavities are separated. A component sub-chassis is slidably mounted in one of the first and second component cavities.

A principal advantage of this embodiment is that the backplane is easily removed and replaced without removing the chassis from the rack.

BRIEF DESCRIPTION OF THE DRAWINGS

FIGS. 4A, 4B and 4C are exploded perspective views illustrating an embodiment of the chassis, a backplane and a sub-chassis.

FIG. 7 is a partial side view illustrating an embodiment of the sub-chassis mounted in the chassis.

FIG. 8 is a partial enlarged view illustrating a gap between chassis flanges.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
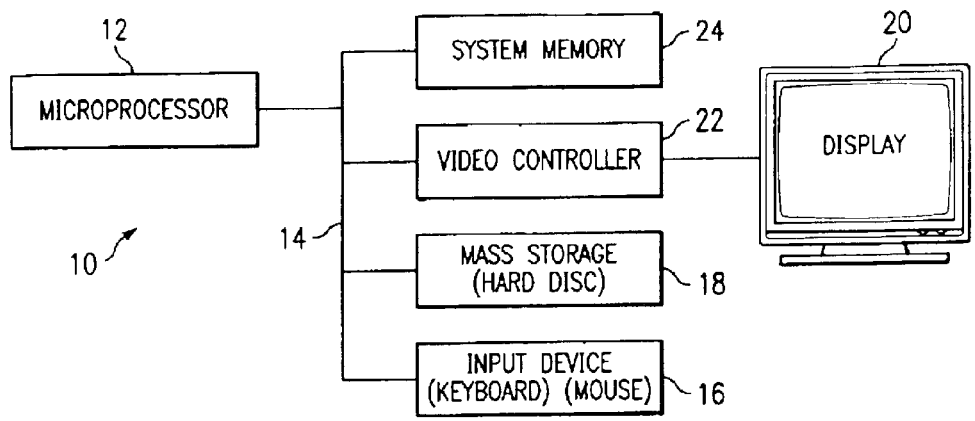
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2C:
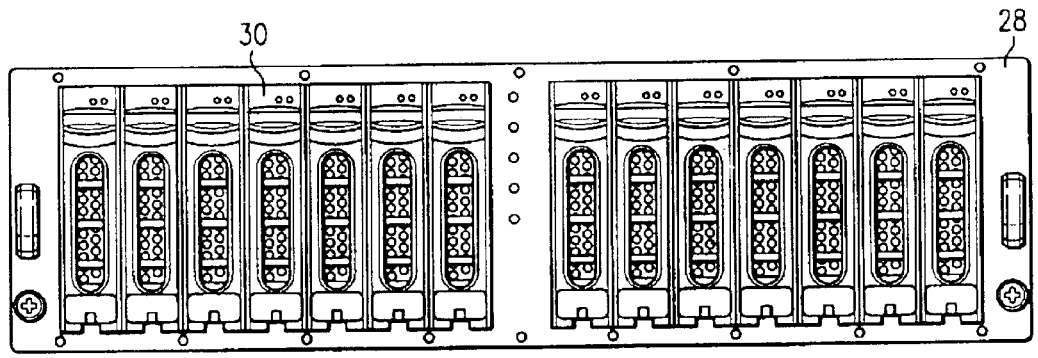
FIGS. 2C–2D illustrate an embodiment of front and rear views of the chassis of FIGS. 2A–2B.
Figure 2D:
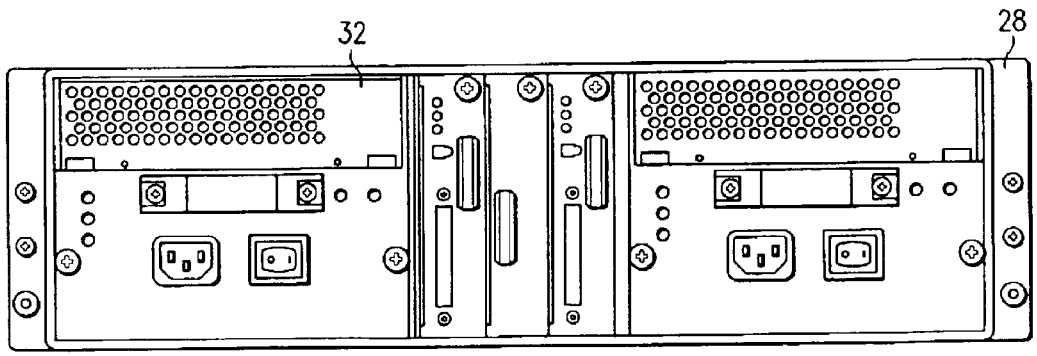
Figure 2A:
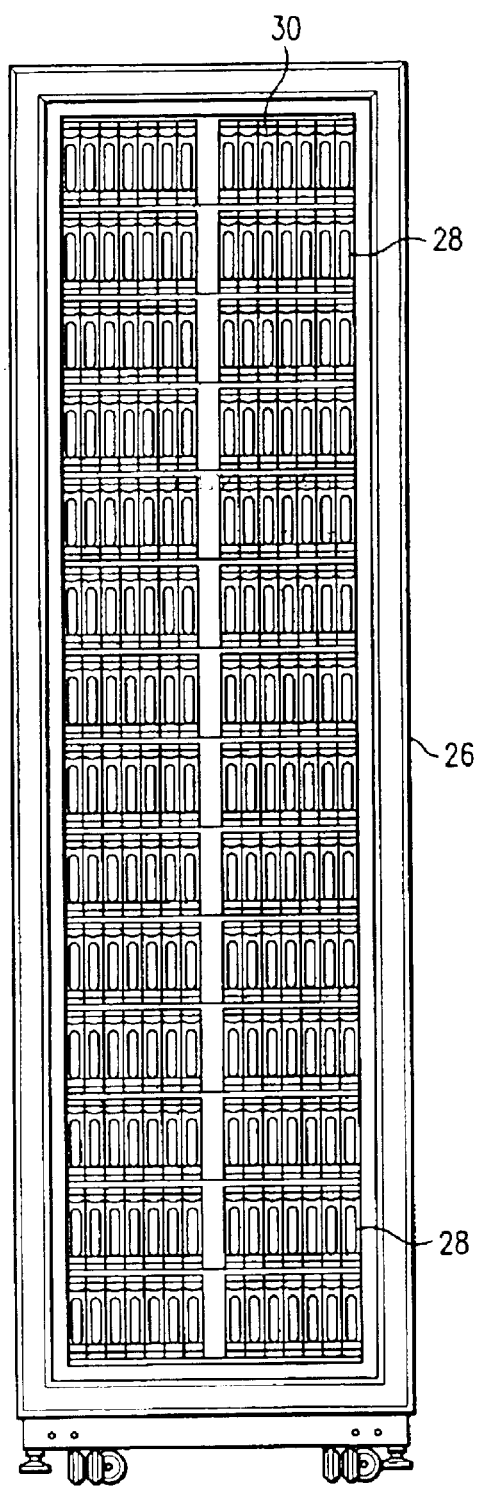
FIGS. 2A–2B illustrate an embodiment of a rack mounted stack of computer chassis.
Figure 2B:
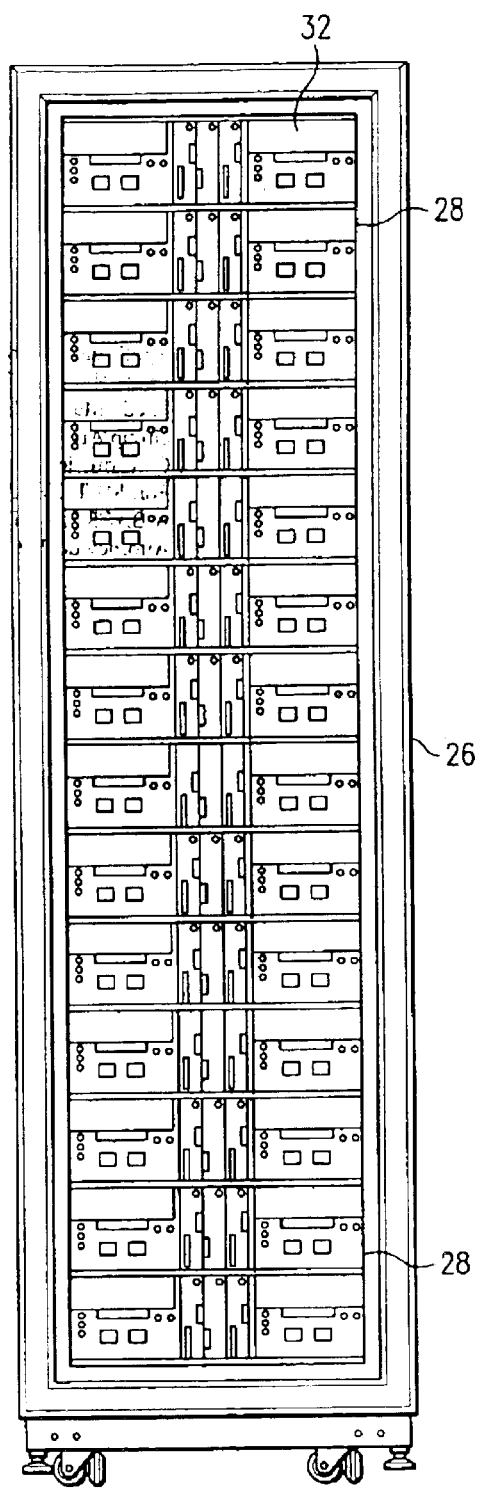

In some computer operations, computer equipment is mounted in a rack 26, FIGS. 2A and 2B. The computer equipment may include, for purposes of this example, a stack of small computer system interface (SCSI) chassis 28. Each SCSI chassis includes a front side 30, FIGS. 2A and 2C, and a rear side 32, FIGS. 2B and 2D. Each SCSI chassis 28, FIG. 3, includes a plurality of components such as a plurality of hot pluggable hard drives 34, insertable into front side 30, a plurality of controller modules 36, insertable into rear side 32 and redundant power supply modules 38, insertable into rear side 32.

Figure 4B:
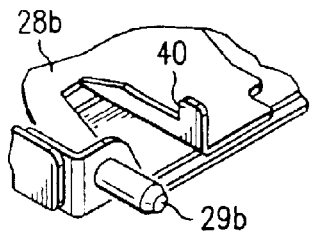
Figure 4C:
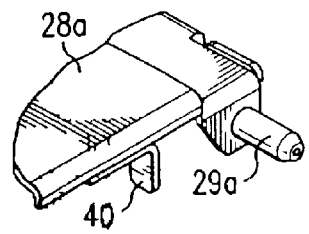

An exploded view of chassis 28, FIG. 4, with the above-mentioned components removed, illustrates the chassis 28 having a plurality of stop members 40, which are mounted along an upper surface 28a of chassis 28 and also along a lower surface 28b of chassis 28, thus providing two rows of stop members 40. Also, provided adjacent each row of stop members 40, are alignment members 29a and 29b, each being respectively adjacent upper and lower surfaces 28a, 28b.

Figure 5:
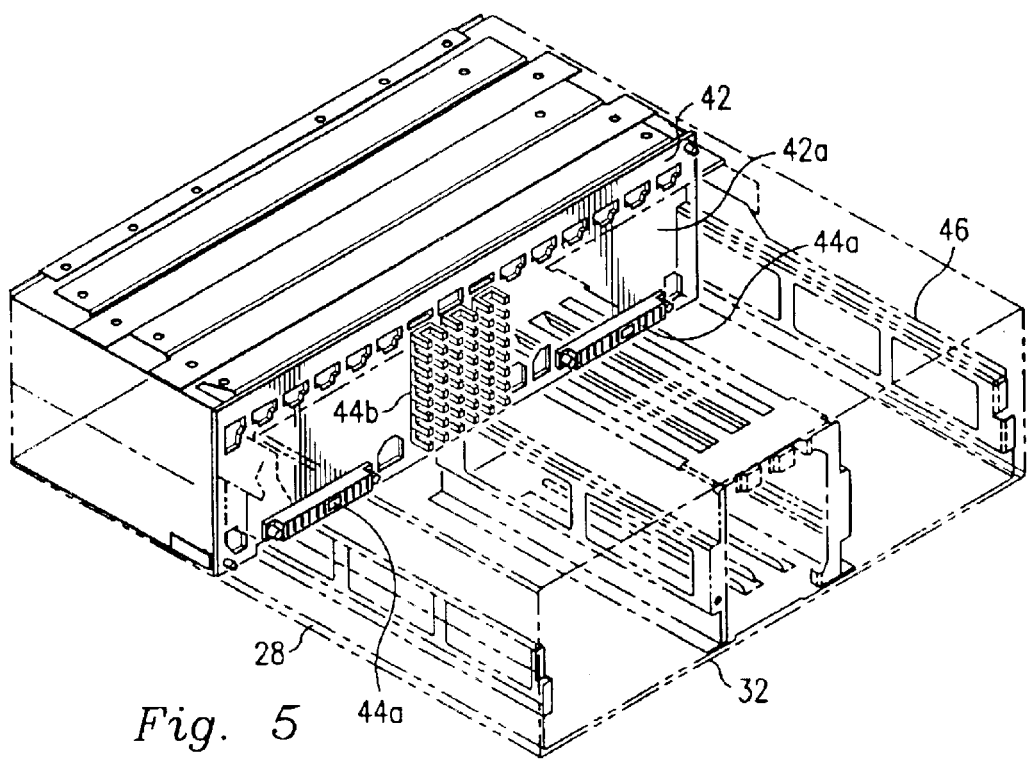
FIG. 5 is an assembled, perspective rear view illustrating an embodiment of the chassis, backplane and sub-chassis.
Figure 6:
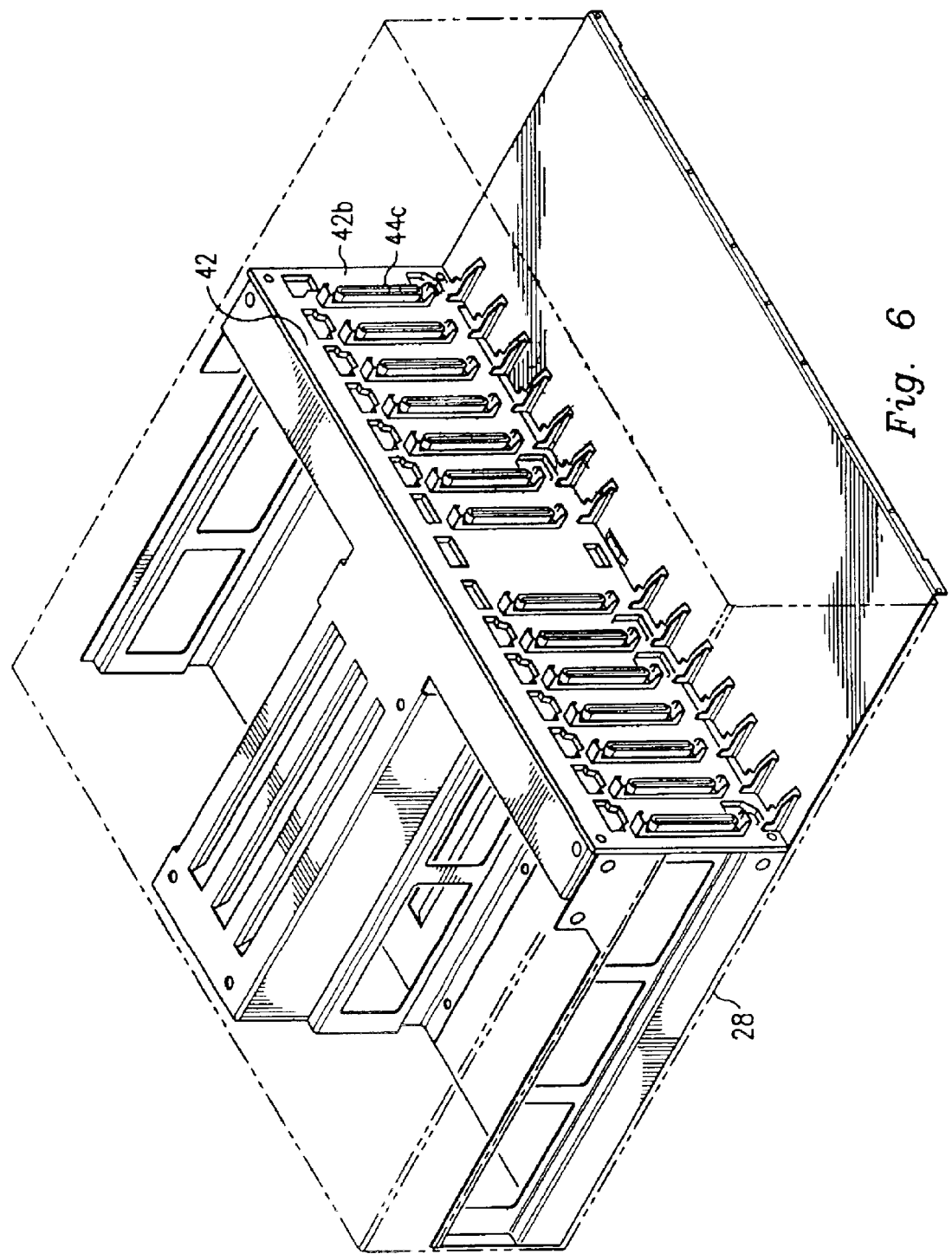
FIG. 6 is an assembled perspective front view of the chassis of FIG. 5.

A backplane or midplane member 42 is mounted within chassis 28, FIGS. 5 and 6, to divide chassis 28 into two separate component cavities and to provide a plug-in base for the above-mentioned components. As such, the backplane 42 includes a plurality of connectors 44a, 44b and 44c. For example, in FIG. 5, connectors 44a and 44b are provided on a first side 42a of backplane 42 for connecting with power supplies 38 and controller modules 36, respectively, whereas connectors 44c, FIG. 6, are provided on a second side 42b of backplane 42 for connecting with hard drive modules 34.

Figure 3:
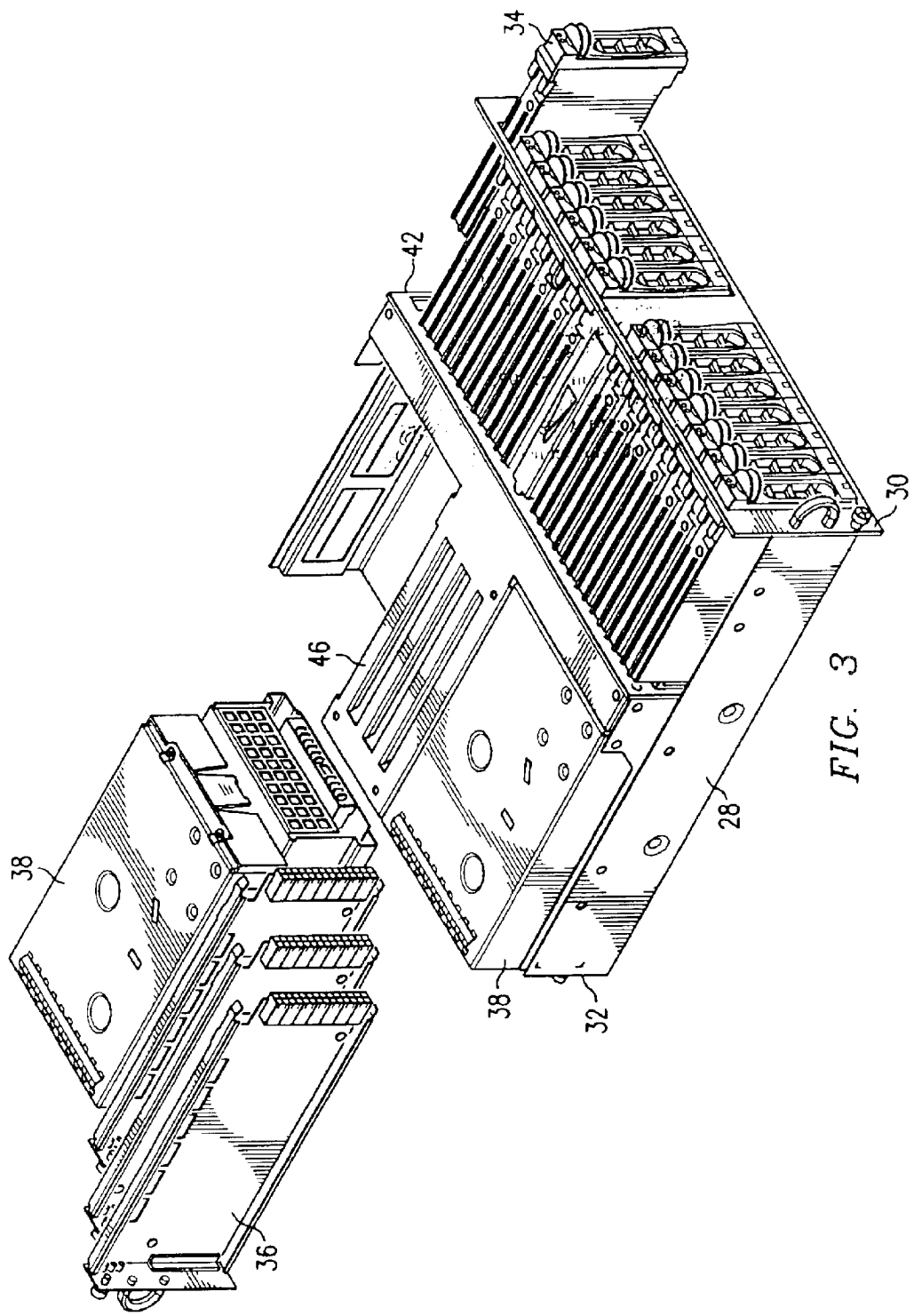
FIG. 3 is a perspective view illustrating an embodiment of components mounted in a chassis.

Also illustrated in FIGS. 3, 4 and 5 is a component sub-chassis 46 which is slidably mounted into the rear side 32 of chassis 28 and is configured to receive and carry the above-mentioned power supplies 38 and controller modules 36.

Backplane 42 is mounted in chassis 28 by abutting engagement with stop members 40 and proper seating is enhanced by a pair of alignment holes 41 which engage alignment members 29a, 29b. There is no need to otherwise secure backplane 42 in chassis 28. Upon insertion of sub-chassis 46 into chassis 28, the components 38, 36 plug into their respective connectors 44a and 44b. An additional securing force is provided as described below.

A pair of recessed flanges 50, FIG. 4 are provided on the rear side 32 of chassis 28. A mating pair of aligned flanges 52 are provided on sub-chassis 46. When sub-chassis 46 is inserted into chassis 28, FIGS. 5, 6 and 7, backplane 42 is sandwiched between stop members 40 and sub-chassis 46. Simultaneously, flanges 50 and 52, FIG. 8, are spaced apart by a gap G. As such, when fasteners 60 are used to secure flanges 50 and 52, the gap G provides a clamping force in the direction F, between the sub-chassis 46 and the backplane 42 to secure and stabilize the backplane 42.

A benefit of this structure is that if it becomes necessary to replace backplane 42, the sub-chassis 46 may be removed including the components 38 and 36 which unplug from their respective connectors 44a and 44b. When sub-chassis 46 is withdrawn from chassis 28, backplane 42 may then be easily, manually removed.

As can be seen, the principal advantages of these embodiments are that instead of using screws requiring special tools to reach the backplane location, this method of mounting includes a stop surface or series of stops providing a resting 30 surface fixed to the chassis at the depth position required to mount the board within the enclosure chassis. The locating method includes pins, and the backplane is positioned within the assembly against the stopping surface and positioned laterally with these pins. A secondary chassis assembly is installed in the opposite side from the stopping surface and rests against the surface of the board and provides the function of clamping the backplane in position without the use of fasteners (this secondary assembly can also have additional functions within the chassis assembly for providing guiding and support for modules and assemblies). The secondary clamping assembly is attached to the chassis (with screws or alternate fasteners) only at the easily accessible outer surface or the edge of the chassis providing fewer fasteners and easy access for installation and removal. This method of mounting the backplane within the assembly eliminates the screws/fasteners at the plane of the board and does not require special tools or deep access within the enclosure for fastener placement and tightening. By also providing the parts in such a way that, when installed, a gap remains and when the screws at the outer surface of the enclosure are tightened, the deflection of mounting components provides a clamping action against the backplane to provide a rigid and accurate mounting while compensating for manufacturing tolerances (part size variations). In addition, by providing locating pins at two diagonal corners, a symmetrical mounting surface is provided such that the chassis components creating the stop surface have the ability to be fabricated from an identical part on the top edge and bottom edge to simplify the product.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computer comprising:
   a chassis having a first end and an opposite second end;
   a stop member provided in the chassis;
   an alignment member extending adjacent the stop member;
   a backplane displaced from the chassis first and second ends and engaged by an extended portion of the alignment member which extends through the backplane;

the chassis having a first component cavity defined on a first side of the backplane and having a second component cavity defined on a second side of the backplane, whereby the backplane separates the first and second component cavities;

a component sub-chassis having a first and second end slidably mounted in the chassis in the second component cavity, the sub-chassis first end engaging the backplane and the extended portion of the alignment member;

the chassis second end including a recessed flange adjacent the second component cavity and spaced from the backplane;

the sub-chassis second end including a second flange aligned adjacent to the recessed flange and spaced therefrom by a gap at the second ends of the chassis and sub-chassis in response to the sub-chassis engaging the backplane; and fastening means for closing the gap at the second end of the sub-chassis and chassis and simultaneously providing a clamping force on the displaced backplane.

2. The computer as defined in claim 1 wherein the chassis includes a plurality of the stop members in a plurality of rows.

3. The computer as defined in claim 1 wherein the chassis includes a pair of recessed flanges.

4. The computer as defined in claim 3 wherein the sub-chassis includes a pair of second flanges aligned with the recessed flanges.

5. The computer as defined in claim 1 further comprising:

a rack including a stack of the chassis.

6. A computer system comprising:

a chassis having a first end and a second end;

a microprocessor mounted in the chassis;

an input coupled to provide input to the microprocessor;

a storage coupled to the microprocessor;

a video controller coupled to the microprocessor;

a memory coupled to provide a storage to facilitate execution of computer programs by the microprocessor;

a stop member provided in the chassis;

an alignment member extending adjacent the stop member;

a backplane displaced from the chassis first and second ends and engaged by an extended portion of the alignment member which extends through the backplane;

the chassis having a first component cavity defined on a first side of the backplane and having a second component cavity defined on a second side of the backplane, whereby the backplane separates the first and second component cavities;

a component sub-chassis having a first end and a second end slidably mounted in the chassis in the second component cavity, the sub-chassis first end engaging the backplane and the extended portion of the alignment member;

the chassis second end including a recessed flange adjacent the second component cavity and spaced from the backplane;

the sub-chassis second end including a second flange aligned adjacent to the recessed flange and spaced therefrom by a gap at the second ends of the chassis and sub-chassis in response to the sub-chassis engaging the backplane; and fastening means for closing the gap at the second end of the sub-chassis and chassis and simultaneously providing a clamping force on the displaced backplane.

7. The computer system as defined in claim 6 wherein the chassis includes a plurality of the stop members in a plurality of rows.

8. The computer system as defined in claim 7 wherein the chassis includes a plurality of the alignment members, each row having an adjacent alignment member.

9. The computer system as defined in claim 6 further comprising:

a rack including a stack of the chassis.

10. A method of mounting a backplane in a computer comprising:

providing a chassis having a first end and a second end;

providing a stop member on the chassis;

extending an alignment member from adjacent the stop member;

providing a first component cavity on a first side of the stop member;

providing a second component cavity on a second side of the stop member;

mounting a backplane on the alignment member displaced from the chassis ends, by extending a portion of the alignment member through the backplane, for separating the first and second component cavities;

slidably mounting a component sub-chassis having a first end and a second end in the second component cavity, the sub-chassis first end engaging the backplane and the extended portion of the alignment member;

providing a recessed flange on the chassis second end adjacent the second component cavity and spaced from the backplane;

including on the sub-chassis second end, a second flange aligned adjacent to the recessed flange and spaced therefrom by a gap at the second ends of the chassis and sub-chassis in response to the sub-chassis engaging the backplane; and fastening the recessed flange to the chassis second flange to close the gap at the second end of the sub-chassis and chassis and simultaneously providing a clamping force on the displaced backplane.

11. The method as defined in claim 10 further comprising:

providing the chassis with a pair of recessed flanges.

12. The method as defined in claim 11 further comprising:

providing the sub-chassis with a pair of second flanges aligned with the recessed flanges.

13. An electronic component housing comprising:

a chassis having a first end and a second end;

a stop member mounted in the chassis;

an alignment member extending adjacent the stop member;

the chassis defining a first component cavity on a first side of the stop member and a second component cavity on a second side of the stop member;

a backplane displaced from the chassis ends and engaged by an extended portion of the alignment member which extends through the backplane, whereby the first and second component cavities are separated;

a component sub-chassis having a first end and a second end slidably mounted on the second component cavity, the sub-chassis first end engaging the backplane and the extended portion of the alignment member;

the chassis second end including a recessed flange adjacent the second component cavity and spaced from the backplane;

the sub-chassis second end including a second flange aligned adjacent to the recessed flange and spaced therefrom by a gap in response to the sub-chassis engaging the backplane; and fastening means for closing the gap at the second end of the sub-chassis and chassis and simultaneously providing a clamping force on the displaced backplane.

14. The component housing as defined in claim 13 wherein the chassis includes a plurality of the stop members in a plurality of rows.

15. The component housing as defined in claim 14 wherein the chassis includes a plurality of the alignment members, each row having an adjacent alignment member.

16. An information handling system comprising:

a chassis having a first end and a second end;

a microprocessor mounted in the chassis;

a storage coupled to the microprocessor;

a stop member provided in the chassis;

an alignment member extending adjacent the stop member;

a backplane displaced from the chassis ends and engaged by an extended portion of the alignment member which extends through the backplane;

the chassis having a first component cavity defined on a first side of the backplane and having a second component cavity defined on a second side of the backplane, whereby the backplane separates the first and second component cavities;

a component sub-chassis having a first end and a second end slidably mounted in the chassis in the second component cavity, the sub-chassis engaging the backplane and the extended portion of the alignment member;

the chassis second end including a recessed flange adjacent the second component cavity and spaced from the backplane;

the sub-chassis second end including a second flange aligned adjacent to the recessed flange and spaced therefrom by a gap in response to the sub-chassis engaging the backplane; and fastening means for closing the gap at the second end of the sub-chassis and chassis for simultaneously providing a clamping force on the displaced backplane.

\* \* \* \* \*